US012763160B2

(12) United States Patent
Soliman et al.

(10) Patent No.: US 12,763,160 B2
(45) Date of Patent: Oct. 13, 2026

(54) CIRCUIT AND METHOD FOR CARRYING OUT A VECTOR OPERATION

(71) Applicant: Robert Bosch GmbH, Stuttgart (DE)

(72) Inventors: Taha Soliman, Renningen (DE); Tobias Kirchner, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 244 days.

(21) Appl. No.: 18/430,945

(22) Filed: Feb. 2, 2024

(65) Prior Publication Data

US 2024/0265986 A1 Aug. 8, 2024

(30) Foreign Application Priority Data

Feb. 8, 2023 (DE) ..................... 10 2023 201 021.6

(51) Int. Cl.
*G11C 27/00* (2006.01)

(52) U.S. Cl.
CPC .................................. *G11C 27/005* (2013.01)

(58) Field of Classification Search
CPC ...................................................... G06N 3/065
See application file for complete search history.

(56) References Cited

U.S. PATENT DOCUMENTS

2003/0199264 A1* 10/2003 Holenstein ............ H04L 25/061 455/295
2022/0366230 A1 11/2022 Squillante et al.
2023/0005529 A1* 1/2023 Hwang ..................... G06F 7/50
2023/0029509 A1 2/2023 Lee et al.
2023/0420014 A1* 12/2023 Park ....................... G06N 3/065

* cited by examiner

*Primary Examiner* — Douglas King
(74) *Attorney, Agent, or Firm* — Norton Rose Fulbright US LLP

(57) ABSTRACT

A circuit for carrying out a vector operation. The circuit includes: memory cells, connected to a column line, each having an input terminal and a semiconductor switching element, the gate terminal of which is connected to the input terminal, and the drain or the source terminal being connected to the column line, wherein when a sufficiently high gate voltage is at the gate terminal, the memory cell is activated so that an electrical cell current is conducted out of or into the column line at suitable voltages; an input voltage circuit connected to the input terminals; a detection circuit connected to the column line and having an analog-to-digital converter which determines a digital value corresponding to the intensity of a measurement current flowing into or out of the column line, the detection circuit being configured to detect the digital value determined by the analog-to-digital converter, and reduce the measurement current.

15 Claims, 5 Drawing Sheets

CIRCUIT AND METHOD FOR CARRYING OUT A VECTOR OPERATION

CROSS REFERENCE

The present application claims the benefit under 35 U.S.C. § 119 of German Patent Application No. DE 10 2023 201 021.6 filed on Feb. 8, 2023, which is expressly incorporated herein by reference in its entirety.

FIELD

The present invention relates to a circuit and to a method for carrying out a vector operation.

BACKGROUND INFORMATION

In many computationally intensive tasks, in particular in artificial intelligence applications or in machine learning applications that use neural networks, the determination of scalar products of vectors is required. For example, the convolutions in a "convolutional neural network," hereinafter referred to as CNN, are scalar products of vectors. In order to carry out such vector operations quickly and efficiently, vector matrix multipliers in the form of circuits specifically provided for this purpose can be used.

In these vector matrix multipliers, which are also referred to as dot product engines, a vector of input voltages is converted into a vector of output currents by means of a matrix-like array of memristors, which are arranged at crossing points of lines running orthogonally to one another, and which connect the crossing lines in pairs, wherein the output currents are each proportional to the scalar product (dot product) of the vector of the input voltages with the conductivities of the memristors arranged in a column. The input voltages are in this case applied to the row lines running in one direction, and result in currents via the memristors into the column lines which run orthogonally thereto and are connected to a ground potential. The intensities of the output currents can be detected by means of analog-to-digital converters in order to obtain corresponding digital values for further processing. The output currents can be converted into output voltages, for example by means of transimpedance amplifiers. Such circuits can reach sizes of in each case a few 100 or 1000 rows and columns.

SUMMARY

According to the present invention, a circuit and a method for carrying out a vector operation as well as a vector operation circuit are provided. Advantageous example embodiments of the present invention are disclosed herein.

The present invention uses the measure of reducing, in a circuit or a method for carrying out a vector operation, a measurement current flowing into or out of a column line connected to memory cells at reduction times by the cell current of already activated cells. It is thereby achieved that the intensity of the measurement current remains relatively small (in comparison to the sum of all possible cell currents) and that an analog-to-digital converter with a low resolution, i.e., a low bit number, can thus be used for the measurement thereof, which analog-to-digital converter has a low energy and space requirement.

Further advantages and embodiments of the present invention can be found in the description and the figures.

The present invention is shown schematically in the figures on the basis of exemplary embodiments and is described below with reference to the figures.

DETAILED DESCRIPTION OF EXAMPLE EMBODIMENTS

Figure 1A:
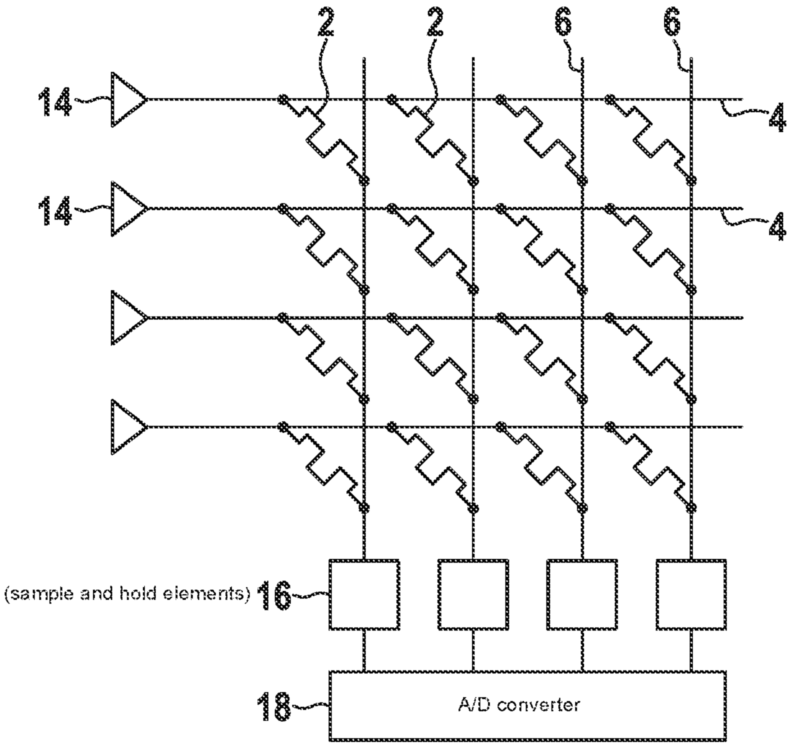
FIGS. 1A and 1B show basic structures of a vector matrix multiplier.
Figure 1B:
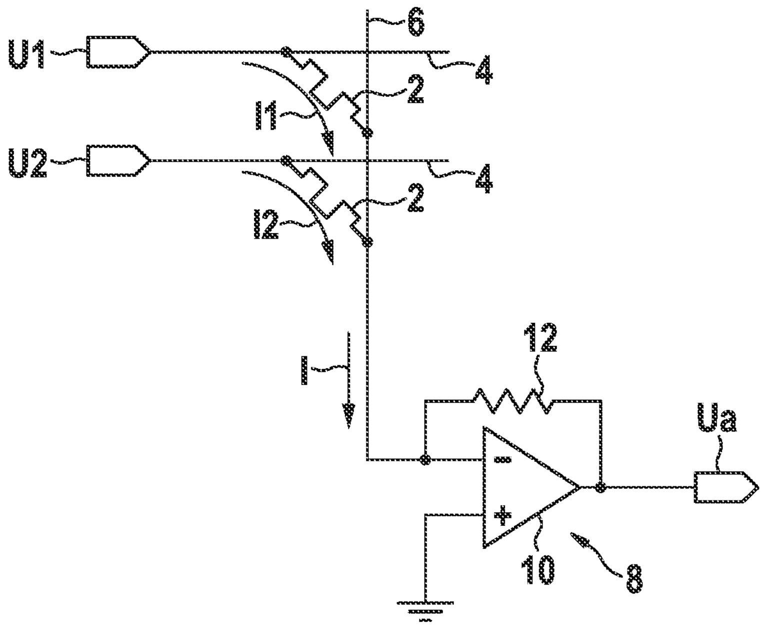

FIGS. 1A and 1B illustrate the functional principle of an examplary vector matrix multiplier, also referred to as matrix circuit or "dot product engine." The vector matrix multiplier comprises memory cells which are arranged in rows and columns in a matrix-like manner, which memory cells are in the form of so-called memristors 2 with a memory function. The number of rows and columns is in each case arbitrary, wherein a 4×4 array is shown by way of example. The memory function of the memristors results from the fact that an electrical resistance of the memristors can be set by applying a programming voltage.

The vector matrix multiplier furthermore comprises a row line 4 for each row of the matrix-like array and a column line 6 for each column. The memristors 2 are arranged at the crossing points of the row lines and column lines running perpendicular to one another, and respectively connect a row line to a column line, which are not connected otherwise.

Unless otherwise mentioned, the terms "connect" refer to electrically conductive connections or connections for electrical signals. The terms "current," "voltage," "resistance," etc. refer to electrical variables.

If voltages are applied to the row lines, currents flow from the row lines 4 through the memristors 2 into the column lines 6. This is illustrated for a column and two rows in FIG. 1B. There, a voltage U1 is applied to one of the row lines, and a voltage U2 is applied to the other. The current I1 through one of the memristors is determined by the conductivity G1 thereof: I1=G1·U1; the current I2 through the other memristor, the conductivity of which is G2, is correspondingly I2=G2·U2. The sum of the currents, i.e., the total current I=I1+I2=G1·U1+G2·U2, then flows through the column line 6. A multiplication of the voltages U1, U2, considered as a vector, at the row lines 4 thus takes place with the conductivities G1, G2, considered as a vector, of the memristors in one column, wherein the total current is proportional to the result of this vector product. Based on the entire matrix array, a multiplication of the vector of the voltages with the conductivities, considered as matrix elements, of the memristors thus takes place in principle. The conductivities can, for example, be understood as weight values of a weight matrix that is multiplied by the vector of the voltages, wherein a high conductivity corresponds to a high weight value. Based on a single column, as shown in FIG. 1B, the total current I can be regarded as a scalar product.

The total current of each column can, for example, be converted into an output voltage Ua by means of a transimpedance amplifier 8 (see FIG. 1B). The transimpedance amplifier 8, which is shown here by way of example and is conventional, comprises an operational amplifier 10, whose inverting input is connected to the column line and whose non-inverting input is connected to ground, and a resistor 12 via which the operational amplifier receives negative feedback, so that the output voltage Ua is given as Ua=−R·I, wherein R is the resistance value of the resistor 12. At the inverting input of the operational amplifier 10, the transimpedance amplifier 8 generates a so-called virtual ground, which, due to the high open-loop gain of the operational amplifier (e.g., 100,000), differs only slightly (e.g., only approximately 50 μV if the voltages U1, U2 are in the range of approximately 5V) from the ground potential so that, in terms of circuitry, the ground potential (i.e., the virtual ground) is applied to the end of the column line, as required for the function of the circuit.

The voltages at the row lines are typically generated from digital signals by means of digital-to-analog converters 14. Likewise, the output voltages at the column lines, i.e., the voltages Ua generated by the transimpedance amplifiers, are typically again converted into a digital signal by means of sample-and-hold elements 16 (sample-and-hold circuits) and analog-to-digital converters 18. The sample-and-hold elements 16 can be integrated in the analog-to-digital converter 18 or in the analog-to-digital converters 18.

Due to the analog-to-digital converters, a considerable area requirement on the chip on which the vector matrix multiplier is implemented, and a considerable energy requirement during operation can arise. The area requirement and energy requirement associated with the analog-to-digital conversion can in each case be in the range of approximately 30-60% of the total area requirement or of the total energy requirement of the circuit.

Figure 2:
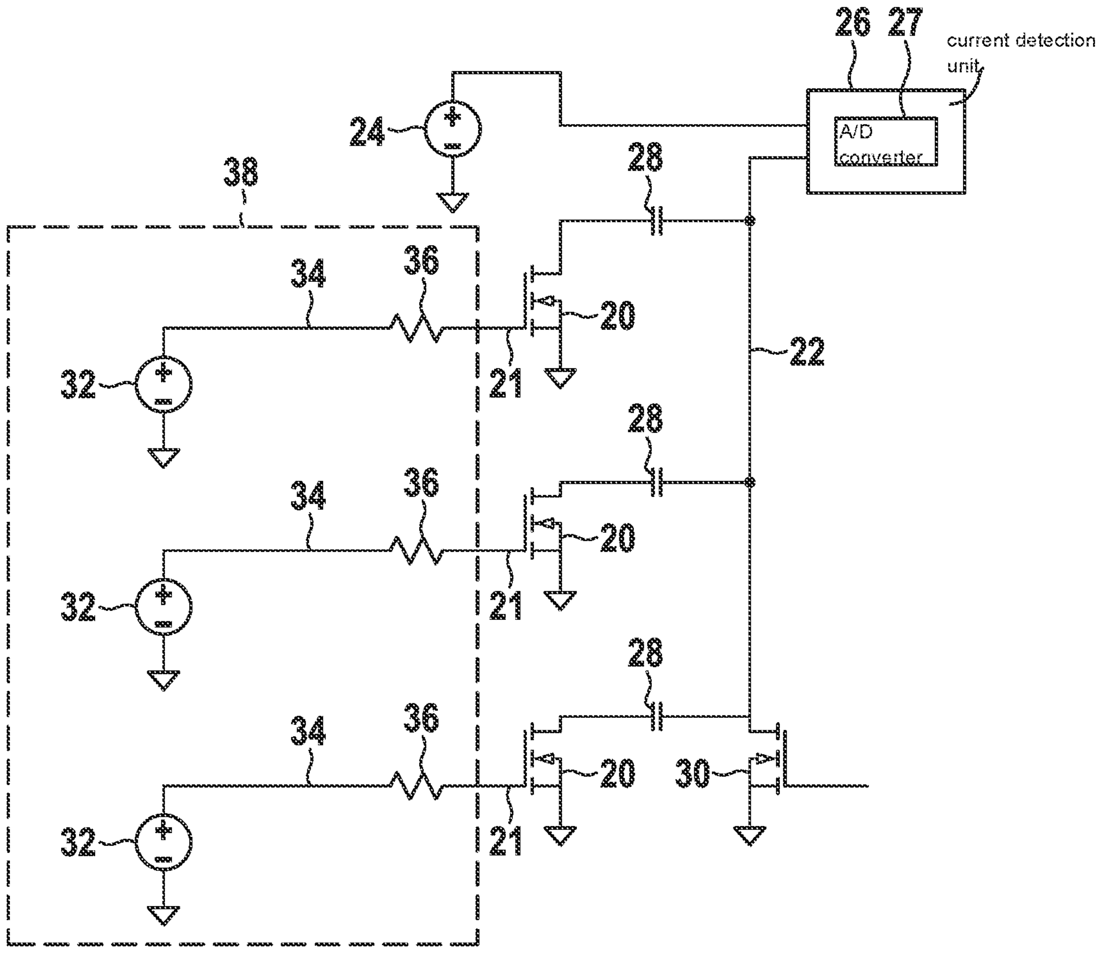
FIG. 2 shows a circuit according to one example embodiment of the present invention.

FIG. 2 shows a circuit according to one embodiment of the present invention. The circuit shown corresponds, for example, to a column of a matrix circuit.

Instead of memristors, as in FIGS. 1A, 1B, memory cells with semiconductor switching elements 22 are used here, wherein the semiconductor switching elements 22 in the embodiment shown are semiconductor switching elements with settable or programmable threshold voltages. Different memory states of the memory cells correspond to different programmed threshold voltages. The programming can take place by means of a programming circuit (not shown), wherein programming voltages are applied to the semiconductor switching elements via lines that are present anyway and/or via specifically provided programming lines in order to program desired threshold voltages. As an alternative or in addition to semiconductor switching elements with programmable threshold voltages, memristors (i.e., as described above, resistors with programmable resistance values) can be used (see FIG. 5).

Based on an operation (e.g., scalar product, as in FIGS. 1A, 1B) between two vectors, namely a weight vector with weight values and an input vector with input values, the threshold voltages can be regarded as weight values, wherein, for example, lower threshold voltages correspond to greater weight values.

In particular, ferroelectric field-effect transistors (FeFET) can be used as semiconductor switching elements. Metal-oxide field-effect transistors with a floating gate (FGMOS, floating-gate metal-oxide semiconductor field-effect transistor) can also be used as semiconductor switching elements. A corresponding material layer of the FET, e.g., a ferroelectric layer in a FeFET or a floating gate in an FGMOS, serves as a memory for the memory states. Memory states correspond to the polarization of the ferroelectric layer in a FeFET or to the charge in the floating gate in an FGMOS. In the circuit shown, n-channel semiconductor switching elements are used. In principle, the use of p-channel semiconductor switching elements is also possible, wherein the voltages and currents would then be reversed accordingly, and the terminals would have to be adapted accordingly to the voltage source and ground.

If the voltage at the gate terminal is below the set or programmed threshold voltage of a memory cell or of a semiconductor switching element 20, no current or a very low current (blocking range or linear range) flows through the semiconductor switching element 20. If the voltage at the gate terminal is above the set threshold voltage (e.g., in the saturation range) of a semiconductor switching element 20, an electrical current flows through the semiconductor switching element 20 (i.e., from the drain terminal to the source terminal). Here, it is assumed that suitable voltages are applied at the drain terminal and the source terminal of the semiconductor switching element 20, i.e., the voltage difference $V_{DS}$ (voltage $V_D$ at the drain terminal minus voltage $V_S$ at the source terminal) across the drain-source path is greater than or equal to the gate-source voltage $V_{GS}$, i.e., the voltage difference (voltage $V_G$ at the gate terminal minus voltage $V_S$ at the source terminal) between the gate terminal and the source terminal minus the threshold voltage $V_{th}$: $V_{DS} \geq (V_{GS} - V_{th})$. The gate-source voltage $V_{GS}$ minus the threshold voltage $V_{th}$ is referred to as the saturation voltage $V_{Dsat} = (V_{GS} - V_{th})$. The exceedance of the threshold voltage by the gate voltage (or by the gate-source voltage) corresponds to an activation of the respective memory cell.

The gate terminals of the semiconductor switching elements 20 are connected to respective input terminals 21 of the memory cells, which in turn are connected to row lines.

A column line 22 is provided, which is connected to a voltage source 24 or current source. Provided in the connection between the voltage source 24 and the column line 22 is a current detection unit 26 with an analog-to-digital converter 27 (also referred to in simplified form as an ADC) which is configured to measure the intensity of the electrical current (also referred to as the measurement current) flowing into the column line 22 and to determine a corresponding digital value. The digital value can be determined as a binary value, as a BCD counter code or thermometer code, as a Gray code, as a BCD code, or as a digital value of another digital number system which is well understood by a person skilled in the art.

The drain terminals of the semiconductor switching elements 20 (memory cells) are connected via respective capacitors 28 to a column line 22. The source terminals of the semiconductor switching elements 20 are connected to ground or ground terminals. Thus, if the threshold voltage is exceeded at the gate terminal of a semiconductor switching element 20, a current (also referred to as a cell current) flows through the drain-source path thereof so that the capacitor 28 that is connected between the drain terminal of this semiconductor switching element 20 and the column line 22 is charged until the saturation voltage is reached. Correspondingly, until the saturation voltage is reached, a current flows from the column line 22 to the capacitor 28 and thus from the voltage source 24 through the current detection unit 26 or via the ADC 27. When the saturation voltage is reached, the current flow through the semiconductor switching element 20 and thus also from the column line 22 to the capacitor 28 ends, i.e., the current flow from the voltage source 24 into the column line 22 is reduced at a certain time, which can be referred to as the reduction time.

In the embodiment shown, a semiconductor switching element (e.g., a MOSFET; metal-oxide semiconductor field-effect transistor) referred to as the discharge semiconductor switching element 30 is furthermore provided, which is connected to the column line 22 so that the capacitors 28 are discharged when the discharge semiconductor switching element 30 is switched into the conductive state (by applying a discharge voltage at the control terminal or gate terminal of the discharge semiconductor switching element). For example, the drain terminal of the discharge semiconductor switching element 30 is connected to the column line 22, and the source terminal of the discharge semiconductor switching element 30 is connected to ground. If the discharge semiconductor switching element 30 is in the non-conductive state, the charge on the capacitors 28 is retained. The current detection unit 26 or its analog-to-digital converter 27 and the capacitors 28 and, where applicable, the discharge semiconductor switching element 30 can be regarded as elements of a detection circuit.

Furthermore, an input voltage circuit 38 or input voltage generation circuit is provided. This circuit is configured to increase the input voltages at the input terminals 21 (or correspondingly the gate voltages at the semiconductor switching elements 20, i.e., the voltage applied to the gates of the semiconductor switching elements 20) starting from a low level, in particular starting from a level of zero (e.g., ground potential) over time (in the case of the shown n-channel semiconductor switching elements) until input voltage levels that correspond to specifiable input values are reached. It should be noted here that, if p-channel semiconductor switching elements are used, the input voltages are reduced starting from zero. In both cases, the input voltages are thus increased in terms of magnitude (starting from a low level in terms of magnitude, in particular zero).

Based on an operation between two vectors (weight vector with weight values, input vector with input values), the input voltage levels can be regarded as input values, wherein high input voltage levels correspond to large input values.

Figure 4:
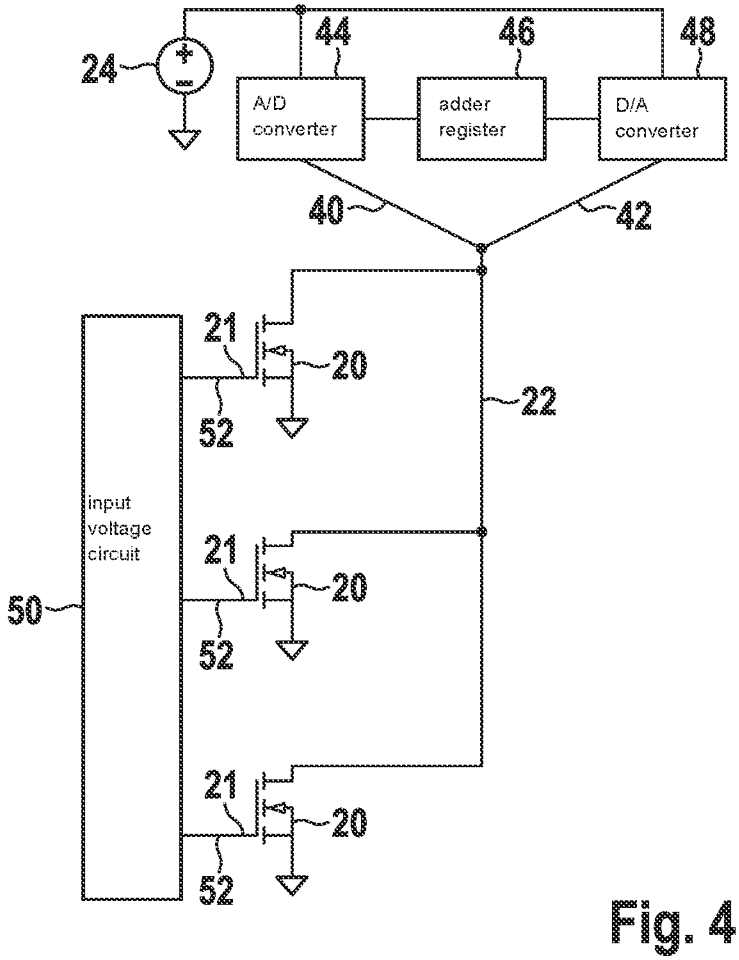
FIG. 4 shows a circuit according to a further example embodiment of the present invention.

In the implementation shown of the input voltage circuit 38 (for a different implementation, which could likewise be used here, see FIG. 4), the latter has input voltage sources 32 and resistors 36. The input voltage sources 32 are connected via row lines 34 to the input terminals 21 of the memory cells (or to the gate terminals of the semiconductor switching elements 20), wherein the resistors 36 are provided in the row lines 34. The input voltage sources 32 are thus connected via the resistors 36 to the input terminals 21 of the memory cells (or to the gate terminals of the semiconductor switching elements 20).

The input voltage sources 32 are configured to provide the input voltages at input voltage levels corresponding to the specification (input values) in a manner that can be switched on and off. That is to say, each of the input voltage sources 32 is actuated to provide an assigned one of the input voltages (namely the one to which the voltage at the input terminal 21 of the memory cell or at the gate voltage of the semiconductor switching element to which the respective input voltage source is connected is to be increased) in a manner that can be switched on and off. In a switched-off state, no voltage is provided (voltage of zero or at ground potential), and, in the switched-on state, the input voltage is provided at the respective input voltage level. The input voltage sources 32 can be actuated in order to switch between the switched-off state and the switched-on state.

If, starting from the switched-off state, the input voltage sources 32 are (simultaneously or substantially simultaneously) switched into the switched-on state, a current flow takes place via the resistors 28, which current flow leads to the gate terminals of the semiconductor switching elements 20 being charged over time, i.e., the gate voltages of the semiconductor switching elements 20 being increased over time. If, at the gate terminal of a semiconductor switching element, the threshold voltage thereof is exceeded, a current flow (cell current) occurs, as explained above, until the saturation voltage is reached at the time referred to as the reduction time.

The detection circuit is furthermore configured to detect the digital value (which corresponds to the measurement current into the column line) determined by the ADC 27, as measurement values at predetermined times, which are referred to as detection times; i.e., the entire current in the column line, which is equal to the sum of the cell currents, in this case represents a measurement current, the intensity of which is measured by the ADC. Since the current from the column line to the capacitors is in each case reduced again at the reduction times, the total current in the column line remains relatively low, assuming that not all semiconductor switching elements switch simultaneously. Accordingly, an ADC with a low resolution, i.e., a low bit number, e.g., 3-bit or 4-bit, can be used, which ADC has a low space and energy requirement. The mentioned assumption is usually met in applications in the field of artificial intelligence or neural networks since the input values and the weight values are typically distributed over respective value ranges. Such applications also have a certain error tolerance if the resolution of the ADC should not be sufficient in individual cases.

It is furthermore provided in one embodiment to assign a weighting to each detection time, wherein the weighting for earlier detection times is greater, and to determine a sum, weighted with the weightings, of the measurement values. In this way, a result of the operation of the two vectors can be determined, which result corresponds to the scalar product, given a suitable selection of the detection times and the weights. The detection circuit can be configured accordingly to carry out this weighted summation (corresponding elements of the detection circuit are not shown for the sake of clarity).

The detection times are in particular selected, for example relative to the reduction times, within the time period (rise time period) in which the input voltages or gate voltages rise or are increased. This selection can be based on a calculation and/or a simulation and/or tests. Since the input values and the weight values, which are typically given as digital values, and thus typically also the input voltage levels and the threshold values each have only a finite number of known discrete values, the possible reduction times can, for example, be determined (by calculation and/or simulation and/or tests) and the detection times can accordingly be defined relative to the possible reduction times so that respective cell currents can be present at these times.

Figure 3:
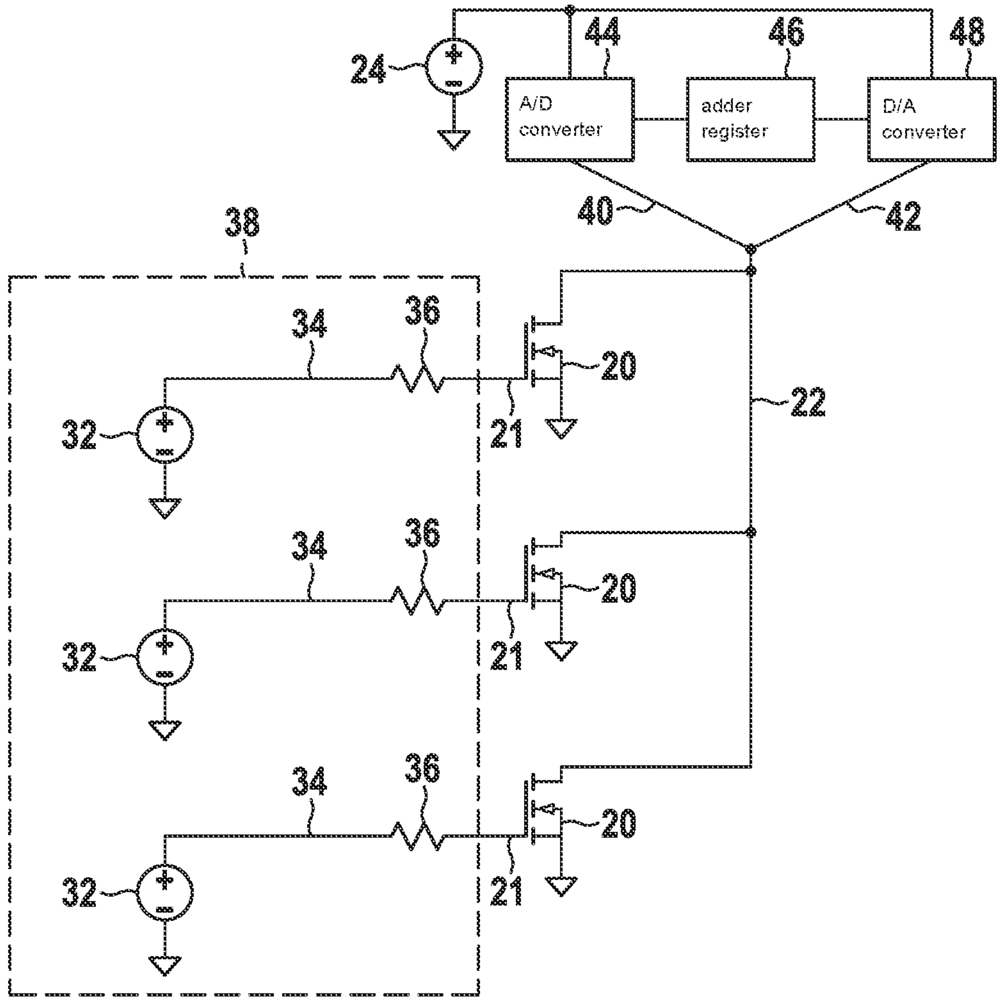
FIG. 3 shows a circuit according to another example embodiment of the present invention.

FIG. 3 shows a circuit according to another embodiment of the present invention.

As in FIG. 2, the memory cells are also designed here as semiconductor switching elements 20 with a programmable threshold voltage so that reference is made to the description of FIG. 2 in this respect. Likewise, the input voltage circuit 38 is again implemented with input voltage sources 32 and resistors 36 so that reference is also made here to the description of FIG. 2 in this respect.

The detection circuit, which differs from that in FIG. 2, has two parallel current paths, namely a measurement current path 40 (or measurement path) and a compensation current path 42 (or compensation path) between the voltage source 24 and the column line 22. Unlike in FIG. 2, neither capacitors between the drain terminals of the semiconductor switching elements 20 nor a discharge semiconductor switching element are provided.

In the embodiment of FIG. 3, the drain terminals of the semiconductor switching elements 20 are connected directly to the column line. As a result, if or as long as the gate voltage of a semiconductor switching element 20 exceeds the threshold voltage of this semiconductor switching element, (unlike in FIG. 2) a current permanently flows from the column line 22 through the respective semiconductor switching element 20 (to ground). This current through a semiconductor switching element represents a cell current.

The voltage source 24 is connected to the column line 22 via the measurement current path 40 and the compensation current path 42 connected in parallel thereto, so that a sum current or column current of a measurement current, which flows via the measurement current path 40, and a compensation current, which flows via the compensation current path 42, flows into the column line. The intensity of the column current is therefore equal to the sum of the intensity of the measurement current and the intensity of the compensation current. The column current in turn is the sum of all cell currents of the semiconductor switching elements 20 connected to the column line 22.

An analog-to-digital converter 44 (for example as part of a current detection unit) is arranged in the measurement current path 40 and is configured to measure the intensity of the measurement current and to determine corresponding digital values, which represent the measurement values, at predetermined detection times.

The measurement values are added up by an adder register 46 configured for this purpose, in order to determine a compensation sum. The compensation path 42 in turn is configured to provide the compensation current in the compensation path such that the intensity thereof corresponds to the compensation sum. For this purpose, a digital-to-analog converter 48 can be arranged in the compensation path 42, which digital-to-analog converter converts the compensation sum present in binary form into a current (compensation current), of which the intensity corresponds to the compensation sum. The adder register 46 is connected to the analog-to-digital converter 44 (ADC) and the compensation path 42 or the digital-to-analog converter 48.

Since the column current remains unchanged at the detection times (unless a detection time coincides with a switching time of a semiconductor switching element 20), the measurement current is thus reduced at these times (or shortly thereafter) by the increase in the compensation current. As in the embodiment of FIG. 2, the measurement current is thus reduced at certain times, which represent reduction times. In this embodiment of the detection circuit, the reduction times are equal to the detection times or are shortly after the detection times if a short time delay due to signal propagation times through the adder register 46 and/or the digital-to-analog converter 48 is taken into account. In particular, a reduction time should in each case be between two successive detection times; i.e., the signal propagation time via the adder register 46 and/or the digital-to-analog converter 48 should be shorter than the time interval between two successive detection times. The detection times can be selected based on a calculation and/or a simulation and/or tests; in particular such that they do not coincide with switching times of the semiconductor switching elements 20.

From the measurement values, as already explained in connection with FIG. 2, a weighted sum can again be determined, wherein the individual measurement values are weighted with weightings that correspond to the detection times at which the respective measurement values were detected.

FIG. 4 shows a circuit according to a further embodiment of the present invention. To the extent related to the detection circuit and the semiconductor switching elements and their connection to one another, this circuit corresponds to that of FIG. 3 so that reference is made to the description there.

The input voltage circuit 50, which is connected via row lines 52 to the input terminals 21 of the memory cell (or to the gate terminals of the semiconductor switching elements 20), is here designed to be different from that of FIGS. 2 and 3. The input voltage circuit 50 is again configured to increase the input voltages over time (in terms of magnitude) or to allow them to rise. The input voltage circuit 50 has digital-to-analog converters (not shown) which are connected to the row line 52 or the input terminals of the memory cells and which are each configured to provide an input voltage at the respective row line or at the respective input terminal, which input voltage corresponds to a digital value with which the respective digital-to-analog converter is actuated. Each digital-to-analog converter is in this case actuated by the input voltage circuit with an increasing sequence of digital values (in terms of magnitude), wherein zero (or a low value) is the starting value and the last value of the sequence corresponds to the input value. The input voltage at the corresponding row line or at the corresponding input terminal 21 thus rises (in terms of magnitude) in stages starting from zero (or ground) or a low value up to the input voltage level that corresponds to the specified input value. In this case, the rise can in particular take place linearly over a rise time period that is the same for all digital-to-analog converters, i.e., the increasing sequences of digital values are determined accordingly. This implementation of the input voltage circuit allows a precise control of the rise in gate voltages.

Apart from the input voltage circuits shown in FIGS. 2, 3, and 4, other input voltage circuits that are suitable for generating the input voltages at the row lines or the input terminals of the memory cells can also be used.

In the embodiments of FIGS. 2, 3, and 4, each memory cell is formed by a respective semiconductor switching element with a programmable threshold voltage. Alternatively or additionally, the memory cells can each include a memristor, i.e., each memory cell (or at least a portion of the memory cells) can include a memristor and a semiconductor switching element (without or with a programmable threshold voltage).

Figure 5:
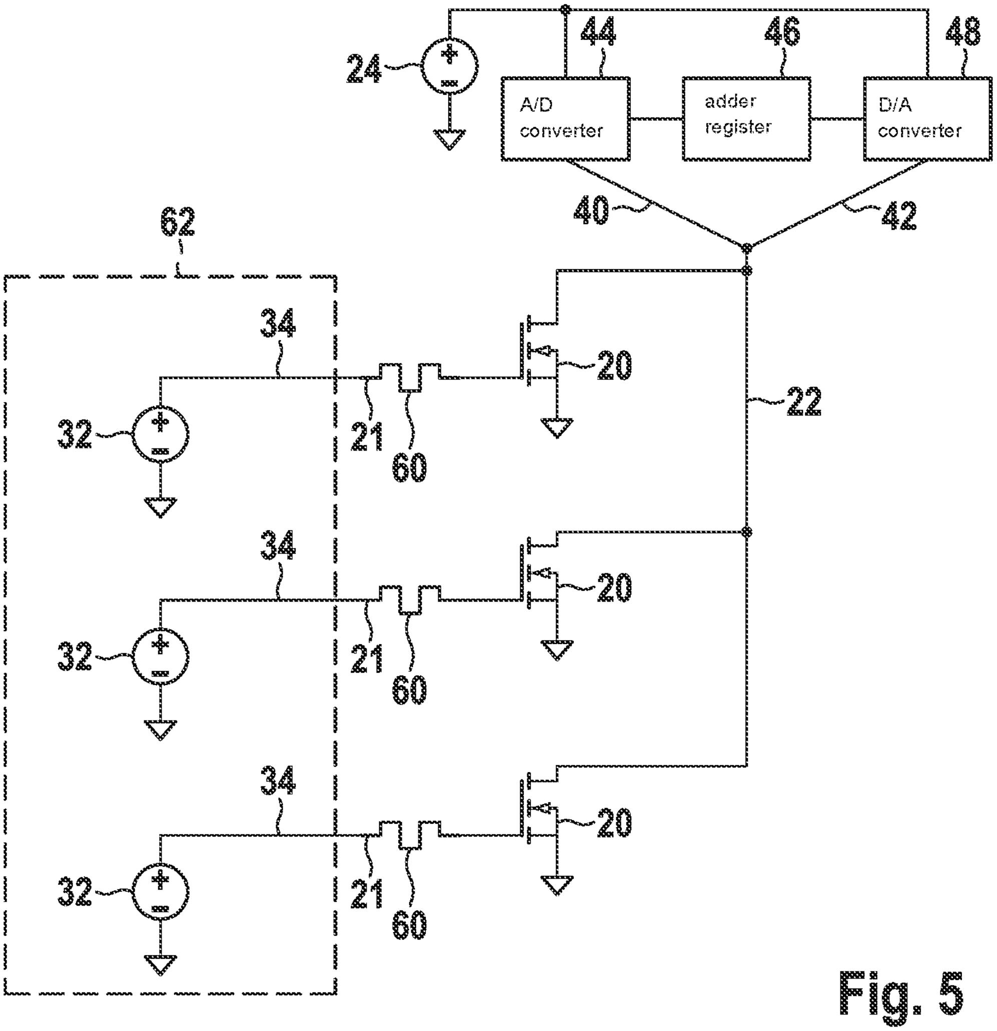
FIG. 5 shows a circuit according to a further example embodiment of the present invention.

A corresponding embodiment is shown in FIG. 5, which shows a circuit according to a further embodiment of the present invention.

Each memory cell in FIG. 5 comprises a semiconductor switching element 20 and a memristor 60. The memristor 60 is in each case connected between the input terminal 21 (which is connected to a corresponding row line 34) and the gate terminal of the semiconductor switching element 20 of the relevant memory cell. The memristors 60 have programmable resistance values or conductivities. The semiconductor switching elements 20 can be semiconductor switching elements without a programmable threshold voltage or semiconductor switching elements with a programmable threshold voltage.

Based on an operation between two vectors (weight vector with weight values, input vector with input values), the resistance values of the memristors can be regarded as weight values, wherein low resistance values, for example, correspond to greater weight values. If semiconductor switching elements with programmable threshold voltages are used, lower threshold voltages, for example, correspond to greater weight values. By using semiconductor switching elements with programmable threshold voltages in addition to the memristors, it is possible, for example, to represent a greater number of different weight values, in particular over a larger value range.

Depending on the programmed resistance value of the memristor 60 of a memory cell, a more or less rapid rise of the gate voltage of the semiconductor switching element 20 occurs. The memory cells are thus activated at corresponding times. Accordingly, an input voltage circuit 62 connected to the row lines 34 can be used, which provides the input voltages directly according to the input voltage levels that correspond to the input values, i.e., without voltage rise. For example, the input voltage circuit can have input voltage sources 32 connected to the row lines 34; wherein the input voltage sources are configured to provide the input voltages with the input voltage levels, similarly to what is shown in FIGS. 2 and 3. Alternatively, one of the input voltage circuits 38, 50 (i.e., with voltage rise) shown in FIGS. 2, 3, and 4 could be used, for example in order to enable better control of the voltage rises.

The detection circuit of the embodiment according to FIG. 5 corresponds, by way of example, to that of FIGS. 3 and 4, to the description of which reference is made. The detection circuit of FIG. 2 could also be used (see the description there).

In the embodiments of FIGS. 2, 3, 4, and 5, one column of a matrix circuit was shown in each case. In the case of a plurality of columns, the input terminals of the memory cells of different columns can be connected to the same row lines, i.e., the row lines extend over a plurality of columns so that a single input voltage circuit can generate the input voltages for a plurality of columns. In the case of a plurality of columns, to the extent related to the embodiment of FIG. 2, a current detection unit 26 with an analog-to-digital converter 27 or, if related to the embodiment of FIGS. 3, 4, 5, a measurement current path 40 and a compensation path 42 connected in parallel thereto can be provided for each column. Alternatively, a current detection unit 26 with an analog-to-digital converter 27 or a measurement current path 40 and a compensation path 42 connected in parallel thereto could be provided for a plurality of the column lines, wherein one of the column lines can respectively be connected thereto via a multiplexer or the like; in this case, input voltages for each column would have to be respectively newly applied.

Figure 6:
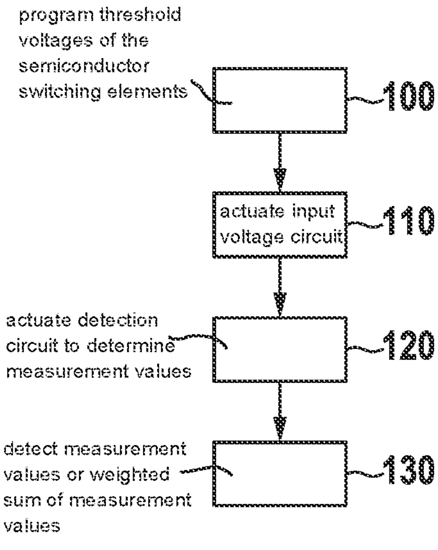
FIG. 6 shows a flow chart according to an exemplary embodiment of the present invention.

FIG. 6 shows a flow chart for carrying out a vector operation between an input vector with input entries and a weight vector with weight entries using a circuit according to an exemplary embodiment.

In an optional step 100, the threshold voltages of the semiconductor switching elements are programmed according to the weight entries before the voltage generation circuit and the detection circuit are actuated.

In step 110, the input voltage circuit is actuated with input values corresponding to the input entries, i.e., the input values are specified according to the input entries of the input vector or the input voltage circuit is actuated therewith (e.g., by transmitting the input values into input registers of the input voltage circuit). The input voltage circuit is also caused to generate the input voltages (for example in a rising manner in terms of magnitude up to an input voltage level according to FIGS. 2, 3, 4, or directly with the input voltage level according to FIG. 5).

In step 120, the detection circuit is actuated or caused to determine the measurement values at the detection times. Here, provision can additionally be made for detection times to be specified to the detection circuit, e.g., for at least one detection time register to be set accordingly.

In step 130, detection of the measurement values or of the weighted sum of the measurement values takes place.

Steps 110, 120, and 130 can be repeated several times without step 100 being carried out again.

A vector operation circuit can comprise an embodiment of a circuit according to the present invention (as shown, for example, in FIGS. 2, 3, and 4) and a control circuit (not shown), which is configured to carry out the above steps.

SPONSORSHIP AND SUPPORT INFORMATION

The project that has led to this application was sponsored by the joint venture ECSEL (JU) within the framework of sponsorship agreement no. 826655. The JU is supported by the research and innovation program Horizon 2020 of the European Union and Belgium, France, Germany, the Netherlands and Switzerland.

What is claimed is:

1. A circuit for carrying out a vector operation, comprising:

a plurality of memory cells which are connected to a column line, wherein each memory cell of the plurality of memory cells has an input terminal and a semiconductor switching element, the semiconductor switching element having a gate terminal connected to the input terminal, and a drain terminal and a source terminal, wherein the drain terminal or the source terminal is in each case connected to the column line, wherein, when a sufficiently high gate voltage in terms of magnitude is at the gate terminal, the memory cell is activated so that an electrical cell current is conducted out of or into the column line at suitable voltages at the drain terminal and at the source terminal;

an input voltage circuit connected to the input terminals and configured or can be actuated to generate input voltages at the input terminals according to specifiable input values;

a detection circuit connected to the column line and having an analog-to-digital converter which is configured to determine a digital value corresponding to an intensity of a measurement current flowing into or out of the column line, wherein the detection circuit is configured to detect the digital value determined by the analog-to-digital converter at predetermined or determinable detection times to determine measurement values corresponding to the detection times, and is configured to reduce the measurement current at reduction times by a cell current of already activated memory cells.

2. The circuit according to claim 1, wherein the detection circuit is configured to determine a weighted sum of the measurement values, wherein each of the measurement values is weighted with a weighting assigned to the corresponding detection time.

3. The circuit according to claim 1, wherein:

the detection circuit has a measurement current path and a compensation path connected in parallel to the measurement, the measurement current path and the compensation paths being connected to the column line, and the detection circuit includes an adder register;

the measurement current path is configured such that the measurement current flows through it into the column line;

the adder register is configured to form a compensation sum of the measurement values;

the compensation path is configured to conduct a compensation current, an intensity of which corresponds to the compensation sum, into the column line.

4. The circuit according to claim 1, wherein: (i) the reduction times are equal to the detection times or are shortly after the detection times, and/or (ii) each reduction time is between two successive detection times.

5. The circuit according to claim 1, wherein the detection circuit has at least one capacitor which is provided between: (i) the drain terminal or source terminal, and (ii) the column line.

6. The circuit according to claim 5, wherein the column line is connected to a discharge semiconductor switching element which is configured to discharge the at least one capacitor when correspondingly actuated.

7. The circuit according to claim 1, wherein a maximum resolvable current intensity of the analog-to-digital converter is less than a fraction of the maximum current intensity of the current flowing in the column line when all memory cells simultaneously conduct cell currents out of or into the column line; wherein the fraction is less than or equal to 0.5.

8. The circuit according to claim 1, wherein the semiconductor switching elements each have a programmable threshold voltage, and wherein the semiconductor switching elements are ferroelectric field-effect transistors or metal-oxide field-effect transistors with a floating gate.

9. The circuit according to claim 1, wherein each memory cell of the plurality of memory cells or a portion of the plurality of memory cells has a memristor which is provided between the input terminal and the gate terminal.

10. The circuit according to claim 8, further comprising:

a programming circuit configured to program the threshold voltages of the semiconductor switching elements and/or resistance values of the memristors according to specifiable weight values.

11. The circuit according to claim 1, wherein the input voltage circuit is configured to generate the input voltages such that they rise in terms of magnitude up to input voltage levels corresponding to the input values.

12. The circuit according to claim 11, wherein:

the input voltage circuit has input voltage sources and resistors, and the input voltage sources are configured to provide the voltages at the input voltage levels, and the input voltage sources are connected via the resistors to the input terminals; and/or the input voltage circuit has digital-to-analog converters which are connected to respective ones of the input terminals of the memory cells and which are each configured to provide a voltage at the respective input terminal, the voltage corresponding to a digital value with which the respective digital-to-analog converter is actuated, and the input voltage circuit is configured to actuate the digital-to-analog converters with increasing sequences of digital values in terms of magnitude until the input values are reached.

13. A method for carrying out a vector operation between an input vector with input entries and a weight vector with weight entries using a circuit including:

a plurality of memory cells which are connected to a column line, wherein each memory cell of the plurality of memory cells has an input terminal and a semiconductor switching element, the semiconductor switching element having a gate terminal connected to the input terminal, and a drain terminal and a source terminal, wherein the drain terminal or the source terminal is in each case connected to the column line, wherein, when a sufficiently high gate voltage in terms of magnitude is at the gate terminal, the memory cell is activated so that an electrical cell current is conducted out of or into the column line at suitable voltages at the drain terminal and at the source terminal, an input voltage circuit connected to the input terminals and configured or can be actuated to generate input voltages at the input terminals according to specifiable input values, a detection circuit connected to the column line and having an analog-to-digital converter which is configured to determine a digital value corresponding to an intensity of a measurement current flowing into or out of the column line, wherein the detection circuit is configured to detect the digital value determined by the analog-to-digital converter at predetermined or determinable detection times to determine measurement values corresponding to the detection times, and is configured to reduce the measurement current at reduction times by a cell current of already activated memory cells;

wherein the method comprises the following steps:

actuating the input voltage circuit with input values corresponding to the input entries, and causing the input voltage circuit to generate input voltages;

actuating the detection circuit to determine the measurement values at the detection times; and detecting the measurement values.

14. The method according to claim 13, wherein the semiconductor switching elements have programmable threshold voltages and/or the memory cells have memristors, wherein programming of the threshold voltages of the semiconductor switching elements and/or of the memristors according to the weight entries is carried out before the voltage generation circuit and the detection circuit are actuated.

15. A vector operation circuit, comprising:

a circuit including:

a plurality of memory cells which are connected to a column line, wherein each memory cell of the plurality of memory cells has an input terminal and a semiconductor switching element, the semiconductor switching element having a gate terminal connected to the input terminal, and a drain terminal and a source terminal, wherein the drain terminal or the source terminal is in each case connected to the column line, wherein, when a sufficiently high gate voltage in terms of magnitude is at the gate terminal, the memory cell is activated so that an electrical cell current is conducted out of or into the column line at suitable voltages at the drain terminal and at the source terminal, an input voltage circuit connected to the input terminals and configured or can be actuated to generate input voltages at the input terminals according to specifiable input values, a detection circuit connected to the column line and having an analog-to-digital converter which is configured to determine a digital value corresponding to an intensity of a measurement current flowing into or out of the column line, wherein the detection circuit is configured to detect the digital value determined by the analog-to-digital converter at predetermined or determinable detection times to determine measurement values corresponding to the detection times, and is configured to reduce the measurement current at reduction times by a cell current of already activated memory cells; and a control circuit which is configured to carry out a vector operation between an input vector with input entries and a weight vector with weight entries using the circuit, the control circuit being configured to:

actuate the input voltage circuit with input values corresponding to the input entries, and causing the input voltage circuit to generate input voltages;

actuate the detection circuit to determine the measurement values at the detection times; and detect the measurement values.

* * * * *